(12) United States Patent
Erickson et al.

(10) Patent No.: US 7,242,074 B2
(45) Date of Patent: Jul. 10, 2007

(54) REDUCED CAPACITANCE RESISTORS

(75) Inventors: Sean C. Erickson, Fort Collins, CO (US); Jonathan Shaw, Fort Collins, CO (US); Kevin R. Nunn, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 240 days.

(21) Appl. No.: 11/005,765

(22) Filed: Dec. 6, 2004

(65) Prior Publication Data

US 2006/0118908 A1 Jun. 8, 2006

(51) Int. Cl.
*H01L 29/00* (2006.01)

(52) U.S. Cl. .................................. 257/532; 257/536

(58) Field of Classification Search ............... 257/532, 257/533, 536–538
See application file for complete search history.

(56) References Cited

U.S. PATENT DOCUMENTS 4,710,791 A * 12/1987 Shirato et al. .............. 257/363
5,994,759 A * 11/1999 Darmawan et al. ......... 257/538
6,320,241 B1 * 11/2001 Okamoto .................... 257/528

* cited by examiner

*Primary Examiner*—Sara Crane
(74) *Attorney, Agent, or Firm*—Cochran Freund & Young LLC

(57) ABSTRACT

A method for reducing the parasitic capacitance in resistors, and a resistor design embodying this method are described. By creating a p-type or an n-type implant inside of an n-well or a p-substrate, respectively, where the n-well or p-substrate is located in a p-substrate or n-substrate, respectively, a capacitively coupled capacitor is formed in series connection with the parasitic inter-layer dielectric capacitance generated when the resistor is fabricated in the dielectric material. The depletion region formed thereby behaves as a series capacitor which reduces the overall capacitance of the assemblage. The n-well or p-substrate can be placed in electrical connection with a ground potential or brought to a chosen voltage to further increase the depletion region and reduce the capacitance of the resistor.

28 Claims, 10 Drawing Sheets

REDUCED CAPACITANCE RESISTORS

FIELD OF THE INVENTION

The present invention relates generally to resistors and, more particularly to the reduction of parasitic capacitance for resistors.

BACKGROUND OF THE INVENTION

Parasitic capacitance is a problem in resistor manufacturing since this additional capacitance reduces the high-speed response of resistors. The effect is area dependant, and is therefore more pronounced when larger-size resistors are fabricated to minimize resistor matching problems for high-precision analog to digital or digital to analog converters. Use of smaller resistors having improved high-frequency response, leads to poor resistor matching; that is, poor reproducibility of the total resistance value for a set of resistors having the same dimensions.

Accordingly, it is an object of the present invention to provide a resistor having reduced parasitic capacitance.

Another object of the invention is to provide a method for reducing parasitic capacitance in resistors.

Additional objects, advantages and novel features of the invention will be set forth, in part, in the description that follows, and, in part, will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the resistor having reduced parasitic capacitance hereof, includes: a chosen dielectric material; a first substrate disposed in the dielectric material and having a surface thereof implanted to a chosen thickness with an effective amount of at least one first selected dopant, forming thereby a resistive layer having a chosen area and having an inter-layer dielectric parasitic capacitance; and a capacitive region disposed in the dielectric material, the capacitive region being series coupled to the inter-layer dielectric parasitic capacitance of the resistive layer.

In another aspect of the invention and in accordance with its objects and purposes, the method for reducing the parasitic capacitance in a resistor hereof includes the steps of: implanting the surface of a first substrate disposed in a chosen dielectric material with an effective amount of at least one first selected dopant to a chosen depth, forming thereby a resistive layer having a chosen area and having an inter-layer dielectric parasitic capacitance; and forming a p-type layer on the surface of an n-type substrate, the n-type substrate being disposed within a p-type substrate and spaced apart from the first substrate, wherein the p-type layer has an effective amount of at least one second dopant, wherein the p-type layer is approximately co-extensive with the resistive layer and parallel thereto, and wherein the p-type layer is in contact with the dielectric material, thereby generating a depletion region which behaves as a reversed-biased diode having a capacitance which is series-coupled with the inter-layer dielectric capacitance of the resistive layer.

In yet another aspect of the invention and in accordance with its objects and purposes, the method for reducing the parasitic capacitance in a resistor includes the steps of: implanting the surface of a first substrate disposed in a chosen dielectric material with an effective amount of at least one first selected dopant to a chosen depth, forming thereby a resistive layer having a chosen area and having an inter-layer dielectric parasitic capacitance; and forming a n-type layer on the surface of an p-type substrate, the p-type substrate being disposed within an n-type substrate and spaced apart from the first substrate, wherein the n-type layer has an effective amount of at least one second selected dopant, wherein the n-type layer is approximately co-extensive with the resistive layer and parallel thereto, and wherein the n-type layer is in contact with the dielectric material, thereby generating a depletion region which behaves as a reversed-biased diode having a capacitance which is series-coupled with the inter-layer dielectric capacitance of the resistive layer.

Benefits and advantages of the present invention include, but are not limited to, precision resistors having reduced parasitic capacitance and improved ac response.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings:

FIG. 1A is a schematic representation of the top view of a resistor designed in accordance with the teachings of the present invention and for which modeling predicts reduced capacitance, while

DETAILED DESCRIPTION

Briefly, the present invention includes a method for reducing the parasitic capacitance in resistors and resistors embodying this method. A capacitively coupled capacitor is placed in series with the inter-layer dielectric capacitor formed when the resistor is fabricated, by creating a p-type implant inside of an n-well. The depletion region formed thereby generates a series-connected capacitor which reduces the overall capacitance, since capacitors placed in series connection cooperate to reduce the capacitance of the assemblage. The n-well can be placed in electrical connection to ground or connected to a common rail (VDD, for example) to form a reverse biased diode, thereby further increasing the depletion region and reducing the capacitance of the resistor.

Reference will now be made in detail to the present embodiments of the invention examples of which are illustrated in the accompanying drawings. In what follows, identical callouts will be used for similar or identical structure.

Figure 1A:
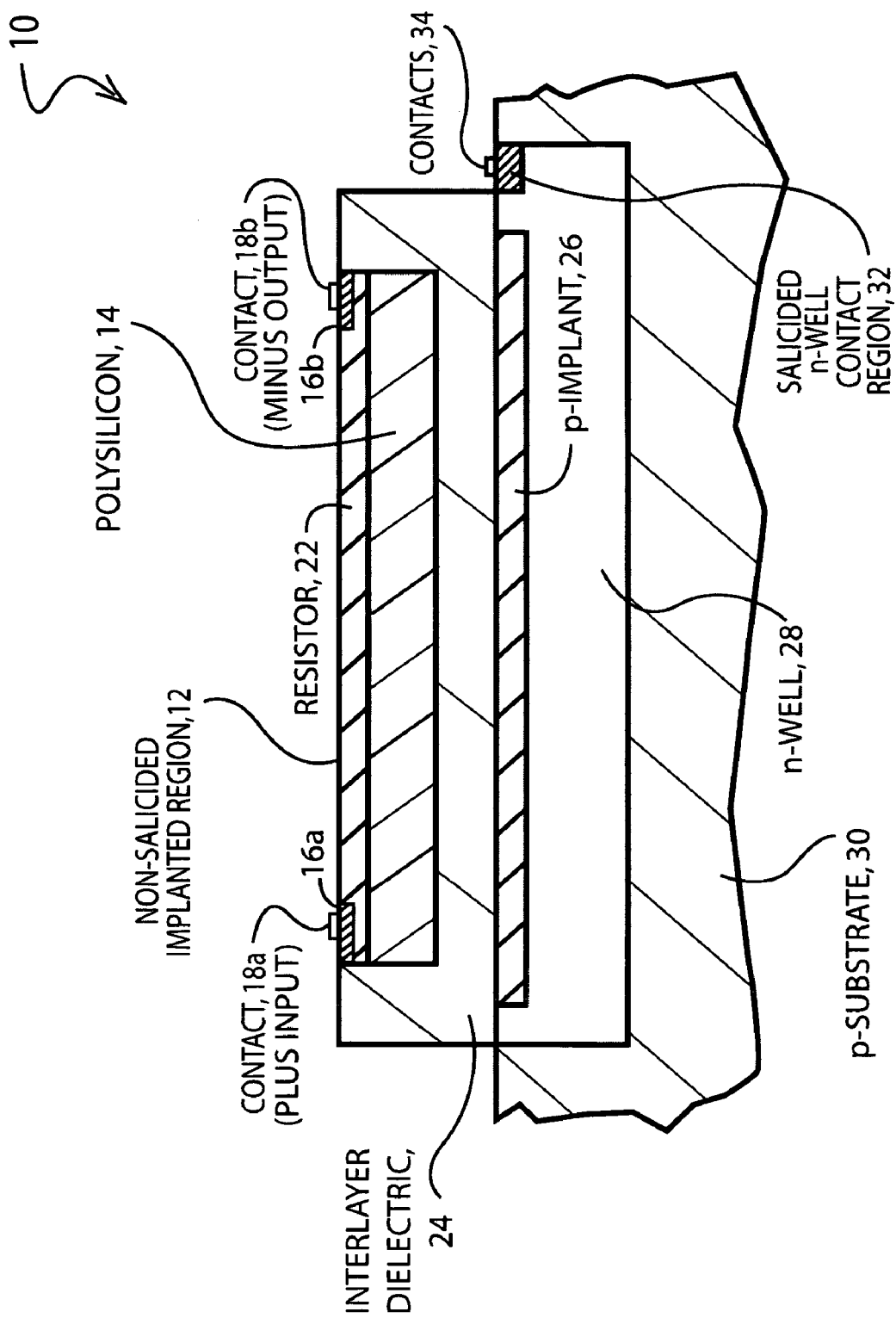
Figure 1B:
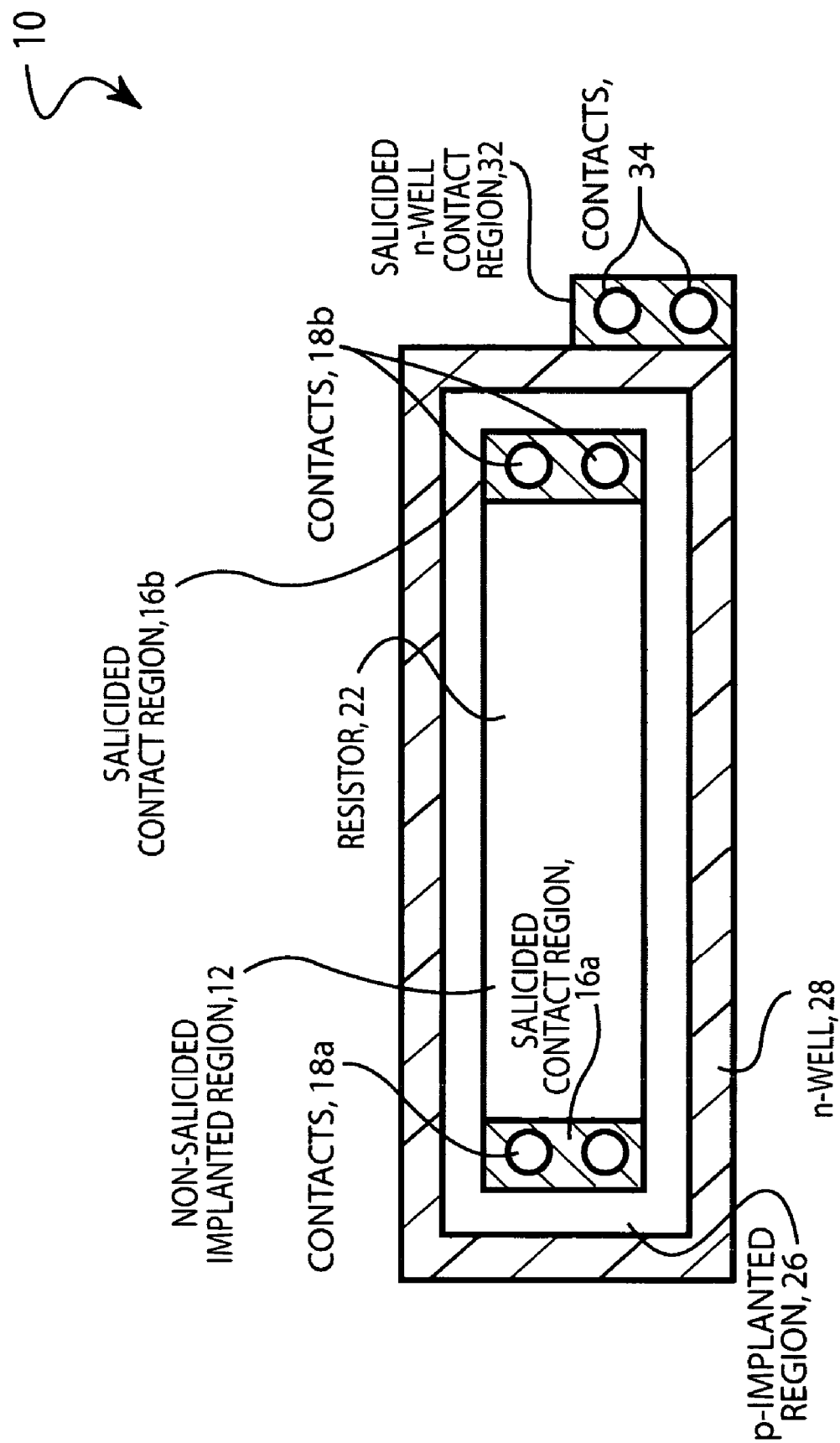
FIG. 1B shows a side cross sectional view thereof.

Turning now to FIG. 1A, hereof, shown is a schematic representation of the side view of one embodiment, 10, of a resistor in accordance with the teachings of the present invention and for which modeling predicts reduced capacitance, while FIG. 1B is a top view thereof. A non-salicided p- or n-implanted region, 12, is formed on polysilicon substrate, 14. Dopant concentrations would range between $10^{18}$ atoms/cm$^3$ and $10^{20}$ atoms/cm$^3$ of boron for p-implants, and arsenic for n-implants. Polysilicon thickness would be approximately 150 nm with the diffusion thickness being about 50 nm. Contact regions 16a and 16b, are further processed by reaction with titanium or cobalt, and the addition of metallic contacts 18a and 18b, forming resistor, 22. Resistance values for resistors fabricated in this manner range from about 10 Ω to 10 k Ω. Resistor 22 is formed on interlayer dielectric, 24, generally formed from a "low-k" dielectric material (dielectric constant less than about 4) such as silicon dioxide, as an example. A p-implanted layer, 26, having a dopant concentration of between $10^{15}$ atoms/cm$^3$ and $10^{17}$ atoms/cm$^3$ of boron for p-implants, and arsenic or phosphorus for n-implants, is formed below this layer. Shown is a p-implant having a thickness of approximately 150 nm and a diffusion thickness of about 50 nm. If either arsenic or phosphorus is used, the layer thickness would be about 600 nm. Dopant concentrations would be between about $10^{15}$ and $10^{16}$ atoms/cm$^3$. Below layer 26, n-well, 28, is formed in p-substrate, 30, upon which the entire structure is formed. The n-well and p-substrate may be doped silicon, as an example. The term n-well is used because in CMOS devices, the substrate is intrinsically p-type. Salicided n-well region, 32, and contacts, 34, permit n-well 28 to be placed in electrical contact with a ground or a VDD rail to form the reverse-biased diode discussed in FIG. 2C hereof, thereby further increasing the depletion region and reducing the capacitance of the resistor. Clearly, n-well 28 and p-substrate 30 can be made p-substrate 28 and n-substrate 30, if p-implant 26 is made an n-implant, with the result that the capacitance of resistor 12 is reduced. Again, the p-substrate and the n-substrate can be fabricated from doped crystalline silicon, as an example, where the p-dopant might be boron and the n-dopant might be arsenic or phosphorus, also as examples.

Figure 2A:
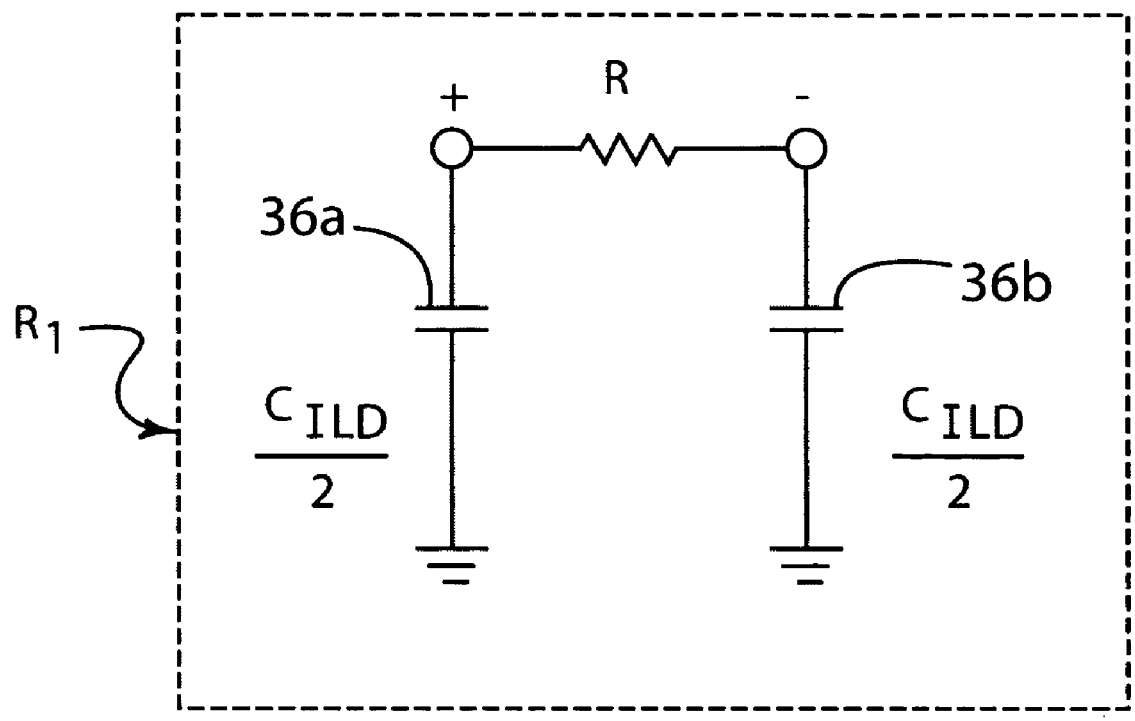
FIG. 2A shows an equivalent circuit using a distributed capacitor model for a resistor, $R_1$ is formed on an interlayer dielectric (ILD), where the resistance is R and $C_{ILD}/2$ is the parasitic capacitance of the resistor shown as a distributed capacitance.
Figure 2B:
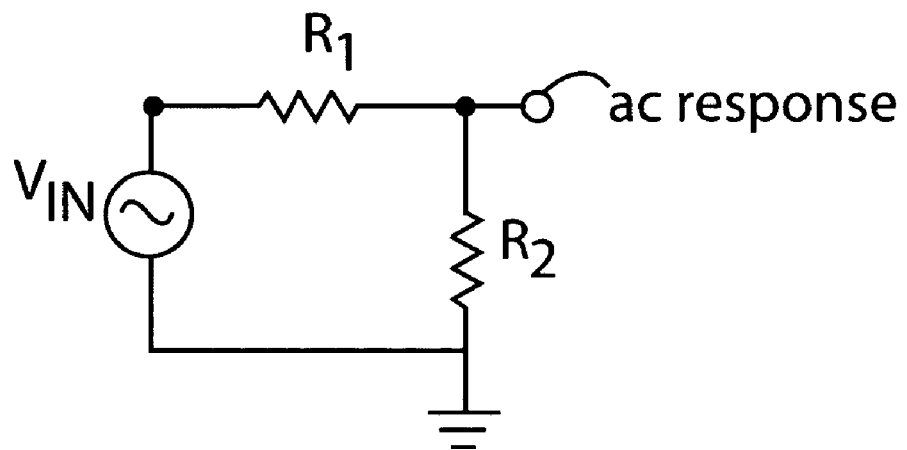
FIG. 2B shows a circuit for determining the ac response of resistor $R_1$, where $V_{IN}$ represents the ac input to resistor $R_1$, and resistor, $R_2$, completes the circuit.

FIG. 2A shows an equivalent circuit using a distributed capacitor model for a resistor, $R_1$ is formed on an interlayer dielectric (ILD), where the resistance is R and the $C_{ILD}/2$ is the parasitic capacitance of the resistor shown distributed in two capacitors, 36a and 36b. FIG. 2B shows a circuit for determining the ac response of resistor $R_1$, where $V_{IN}$ represents the ac input to resistor $R_1$, and resistor, $R_2$, completes the circuit.

Figure 2C:
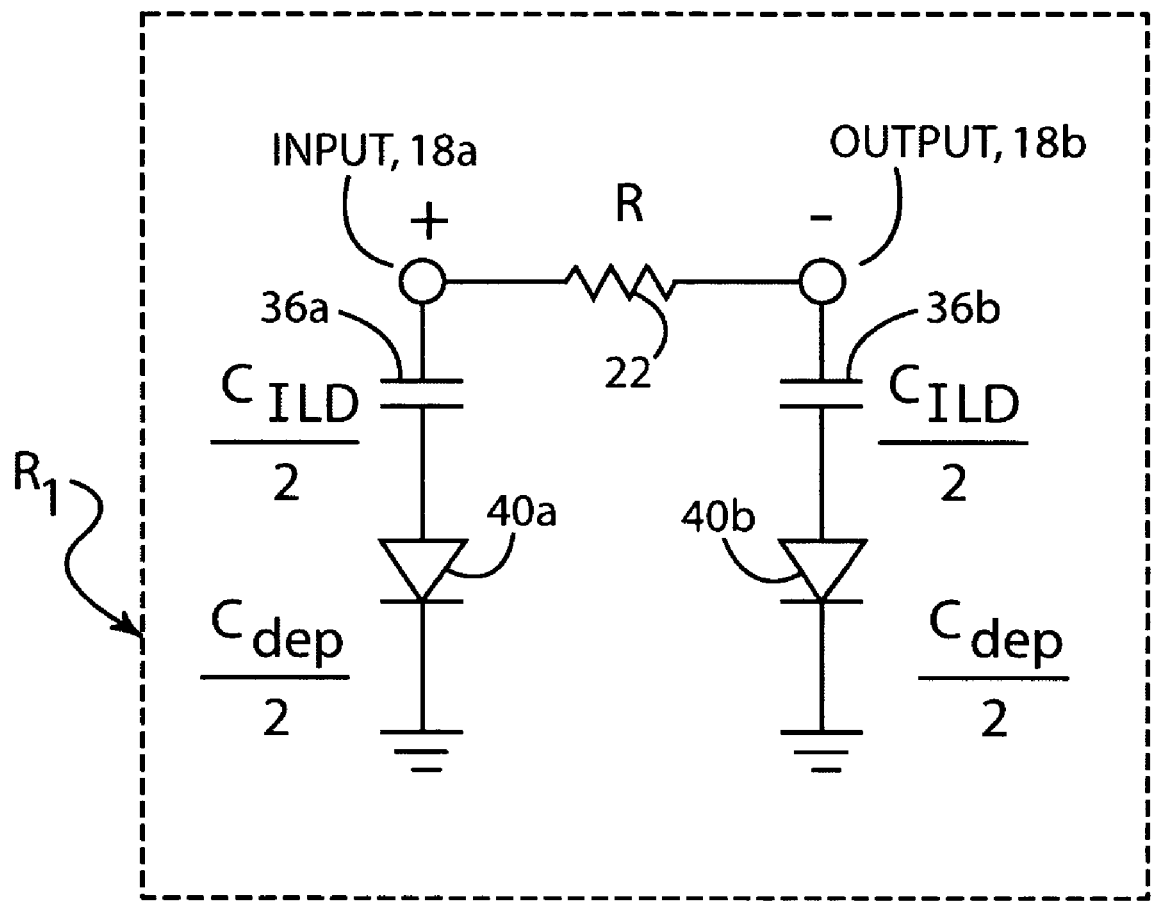
FIG. 2C shows an equivalent circuit for the resistor, R, of the present invention illustrated in FIG. 1A and FIG. 1B hereof, where the parasitic capacitance of resistor, R, is again $C_{ILD}/2$, shown as a distributed capacitance with each capacitor being connected in series to a diode having a capacitance value of $C_{DEP}/2$, where $C_{DEP}$ represents the capacitance of the deposited layers shown in FIGS. 1A and 1B hereof.

FIG. 2C shows an equivalent circuit for the resistor, R, 22 of the present invention illustrated in FIG. 1A and FIG. 1B hereof. The parasitic capacitance of resistor, R, is shown resulting from capacitors, 36a and 36b, each having capacitance given by $C_{ILD}/2$. Coupled to each of capacitors 36a and 36b is a reversed-biased diode, 40a and 40b, respectively, each diode having a capacitance value of $C_{DEP}/2$, where $C_{DEP}$ represents the capacitance of layers 26 and 28 of FIG. 1A hereof, which together form reverse-biased, n-well diode. The total equivalent capacitance for the resistor of the present invention is given by the relationship $C_{EQ}=(C_{DEP})(C_{ILD})/[C_{DEP}+C_{ILD}]$. It is seen that a factor of 2 reduction in the parasitic capacitance for resistor 22 occurs when $C_{DEP}=C_{ILD}$. The conditions under which this exact relationship may be obtained are difficult to specify, since process parameters are difficult to precisely control. Additionally, when $C_{DEP}$ is much smaller than $C_{ILD}$, $C_{EQ} \approx C_{DEP}$, and much more significant reductions in $C_{EQ}$ can be achieved.

Figure 3:
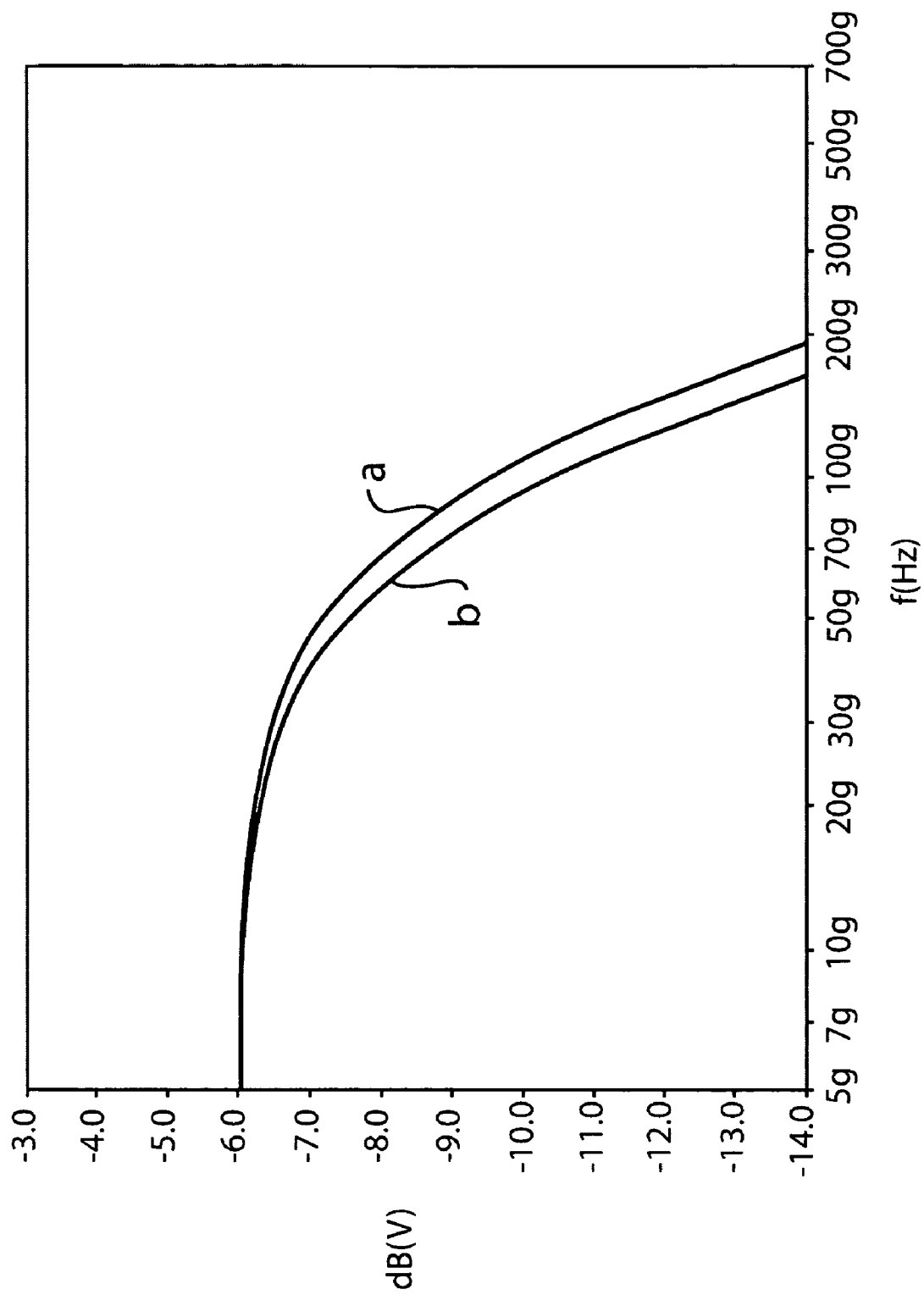
FIG. 3 is a graph of the predicted output voltage as a function of the frequency of the applied voltage (using the circuit shown in FIG. 2B hereof) for the resistor of the present invention illustrated in FIGS. 1A and 1B hereof and having the equivalent circuit schematically shown in FIG. 2C hereof (curve a), compared with a resistor having the equivalent circuit shown in FIG. 2A hereof.

FIG. 3 is a graph of the predicted output voltage as a function of the frequency of the applied voltage (using the circuit shown in FIG. 2B hereof) for the resistor of the present invention illustrated in FIGS. 1A and 1B hereof and having the equivalent circuit schematically shown in FIG. 2C hereof (curve a), compared with a resistor having the equivalent circuit shown in FIG. 2A hereof. Curve a shows a clearly improved ac frequency response over that for curve b.

Figure 4A:
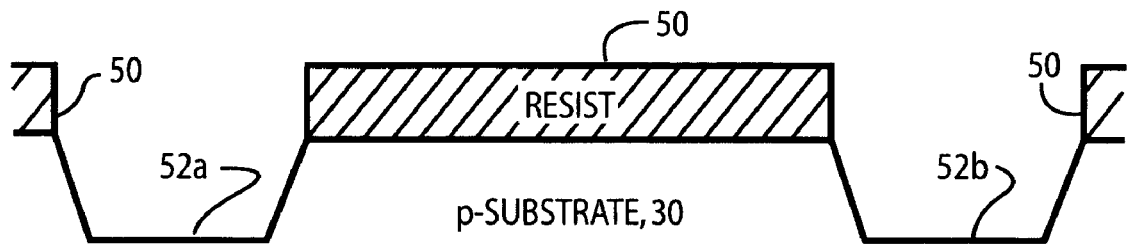
FIGS. 4A-4K are schematic representations of one embodiment of a proposed process for fabricating the reduced-capacitance resistor of the present invention.
Figure 4B:
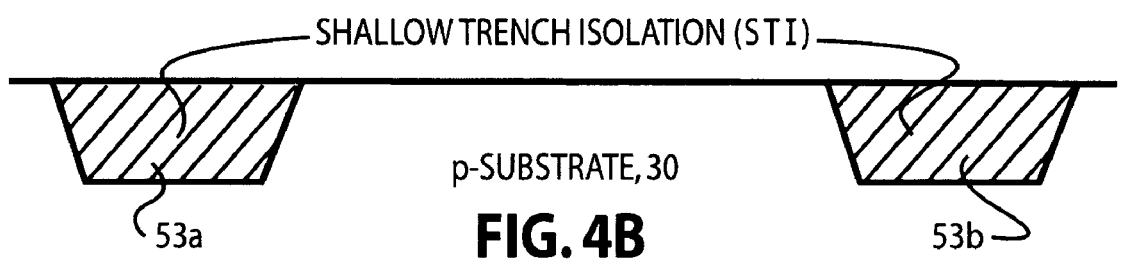
Figure 4C:
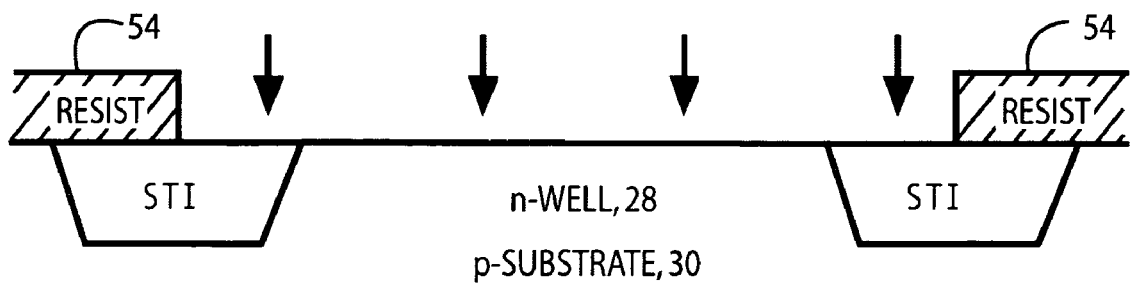
Figure 4D:
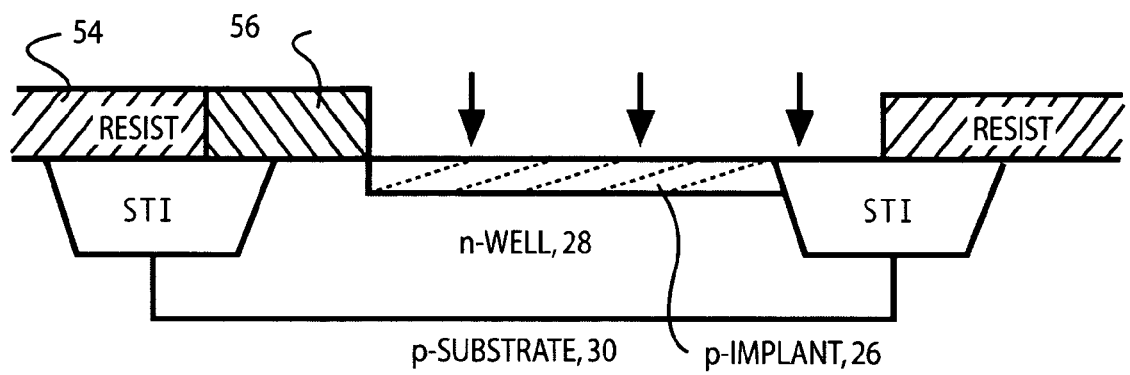
Figure 4E:
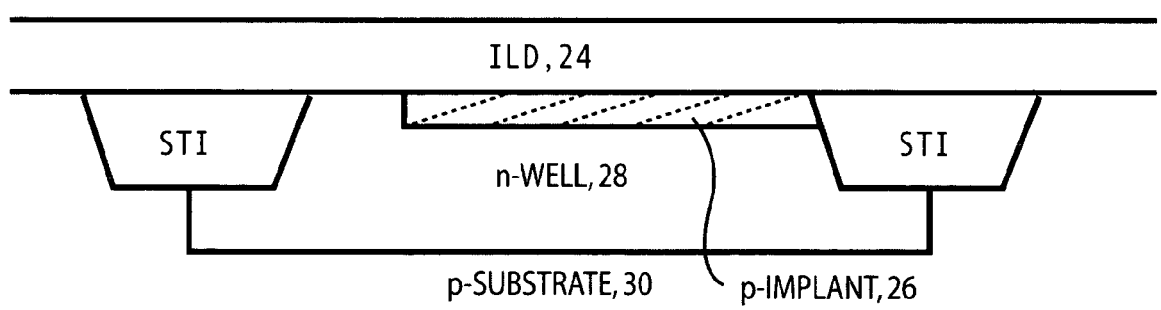
Figure 4F:
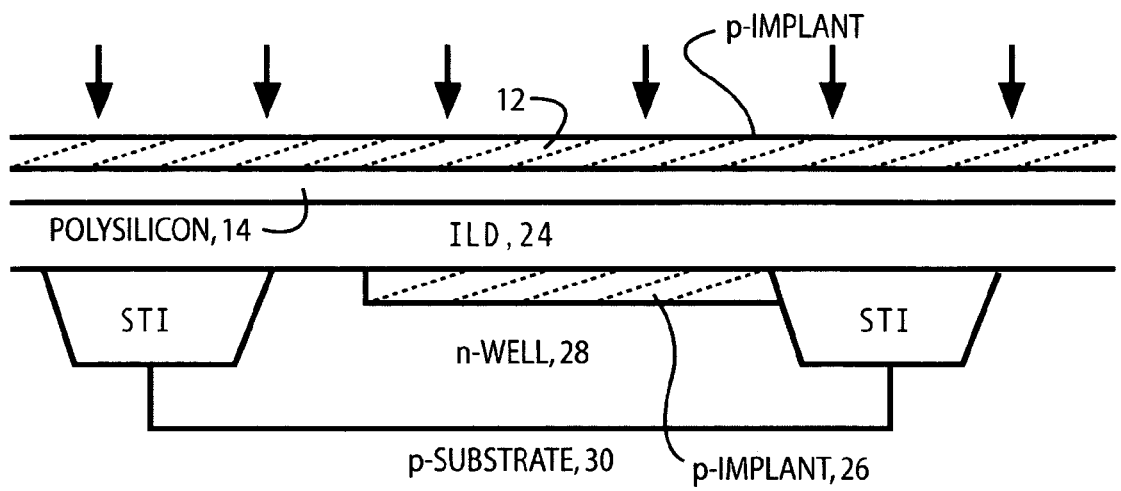
Figure 4G:
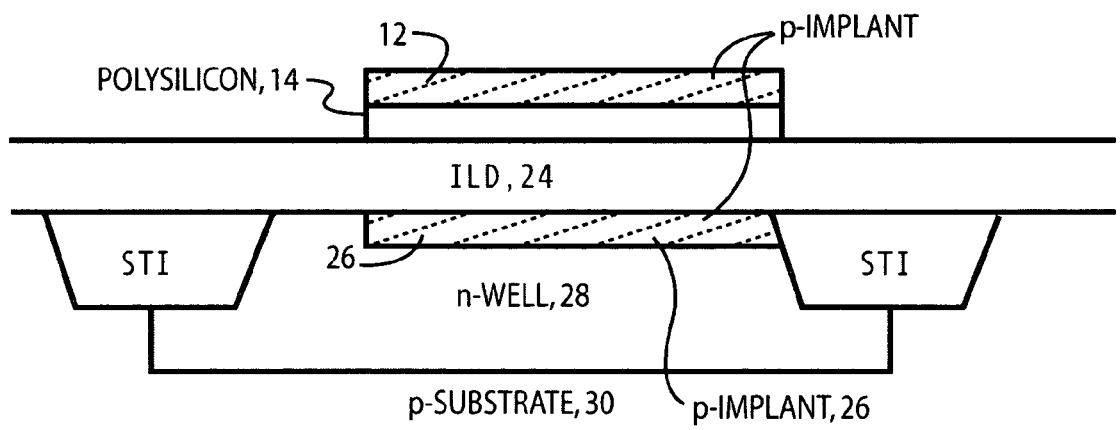
Figure 4H:
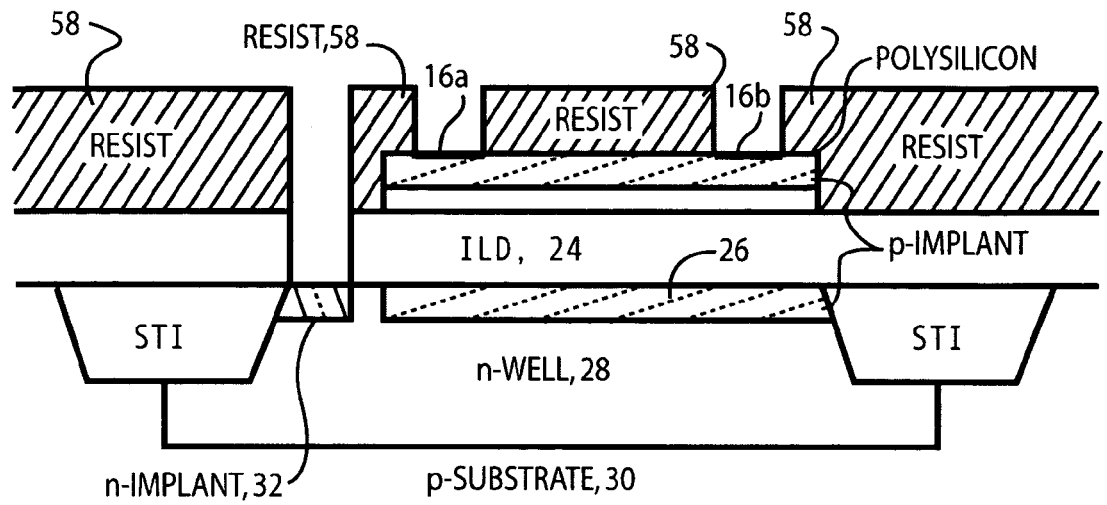
Figure 4I:
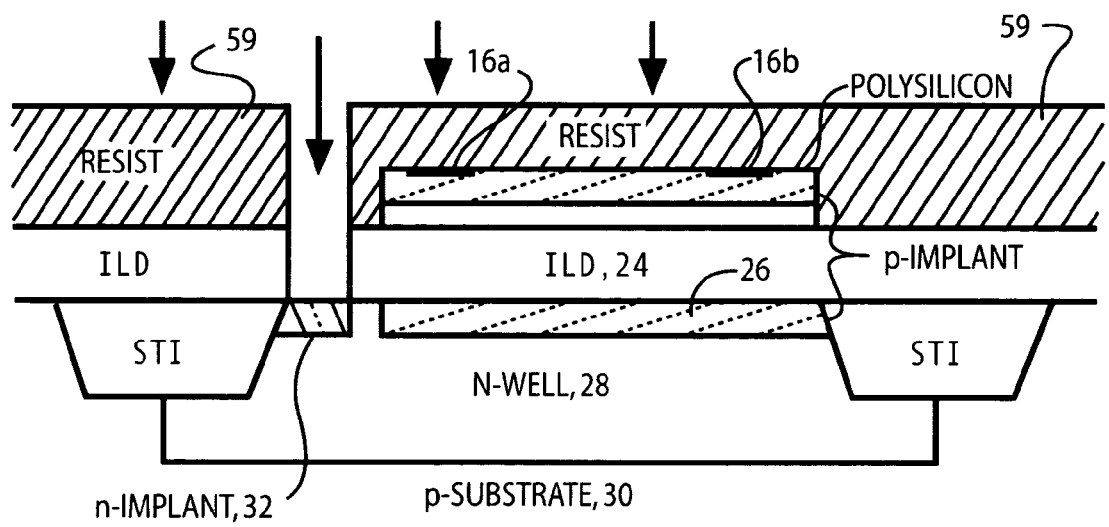
Figure 4J:
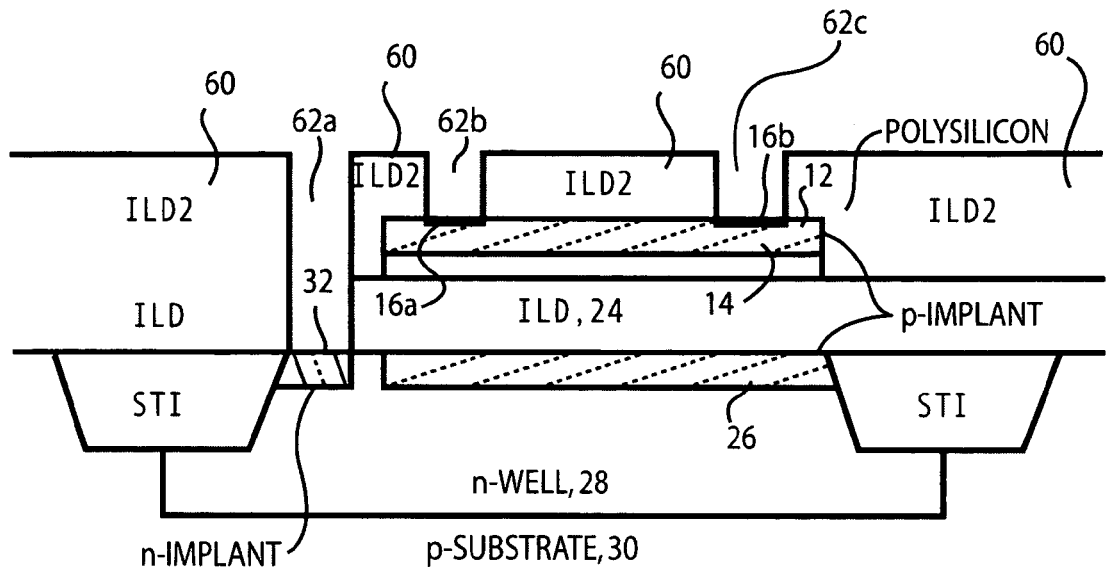

As an example of the fabrication of the reduced-capacitance resistor of present invention, but not limited thereto, FIGS. 4A-4K describe a proposed process therefor:

(1) a resist pattern, 50, is formed on p-type substrate, 30, and trenches 52a and 52b are etched for oxidation isolation (FIG. 4A);

(2) resist 50 is removed, and shallow trenches 52a and 52b are filled with oxide material, 53a and 53b for isolation, and the surface of the substrate planarized by oxidation (FIG. 4B);

(3) resist 54 is formed on substrate 30, and n-well 28 is formed by implantation (FIG. 4C);

(4) resist 54 is extended, 56, and a p-implanted layer, 26, is formed on n-well 28, forming a diode (FIG. 4D);

(5) interlayer-dielectric (ILD), 24, is formed by oxidation followed by planarization of the surface of the substrate (FIG. 4E);

(6) polysilicon layer, 14, is deposited and planarized, and p-implant layer, 12, formed (FIG. 4F);

(7) polysilicon 14 layer and p-implanted polysilicon layer 12 are etched to size (FIG. 4G)), after protection of the remainder of the surface with a resist;

(8) resist 58 is formed, and ILD, 24, is etched to form contacts, 16a and 16b (FIG. 4H);

(9) resist 58 is removed and new resist, 59, is formed, in order to form n-well contact, 32 (FIG. 4I);

(10) resist 59 is removed, and the surface oxidized to form a second interlayer dielectric (ILD2), 60, which is planarized, and another resist is formed to enable contact holes 62a-62c to be created (FIG. 4J) (note that ILD2 may be a similar or identical material to ILD, 24); and

Figure 4K:
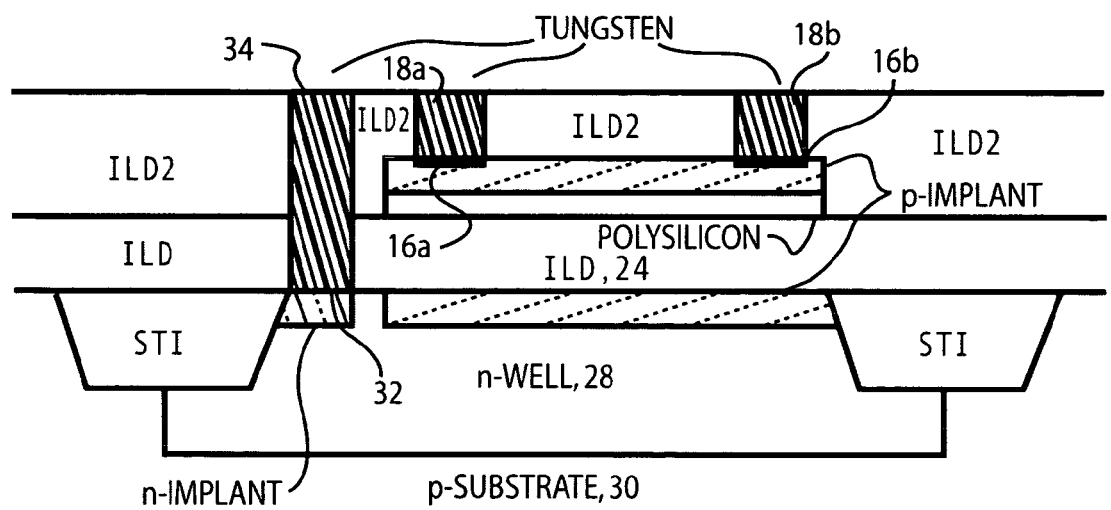

(11) contact holes 62a-62c are filled with tungsten, as an example, followed by surface planarization, thereby forming the resistor of the present invention (FIG. 4K).

The foregoing description of the invention has been presented for purposes of illustration and description and is not intended to be exhaustive or to limit the invention to the precise form disclosed, and obviously many modifications and variations are possible in light of the above teaching.

The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A resistor having reduced parasitic capacitance comprising:
   (a) a chosen dielectric material having a first side and a second side;
   (b) a first substrate disposed on the first side of said dielectric material and having a surface thereof implanted to a chosen thickness with an effective amount of at least one first dopant, forming thereby a resistive layer having an inter-layer dielectric parasitic capacitance; and
   (c) a reverse-biased diode comprising a p-implanted layer formed on an n-well which is formed in a p-type substrate, said p-implanted layer disposed in contact with the second side of said dielectric material, said reversed-biased diode having a capacitance and being series coupled to the inter-layer dielectric parasitic capacitance of said resistive layer.

2. The resistor of claim 1, wherein said p-implanted layer comprises an effective amount of at least one second dopant, and wherein the p-implanted layer is approximately co-extensive with said resistive layer.

3. The resistor of claim 2, wherein said n-well is placed in electrical connection with a ground potential or a chosen voltage.

4. The resistor of claim 2, wherein said n-well and said p-type substrate comprise crystalline silicon.

5. The resistor of claim 4, wherein said at least one second dopant comprises boron.

6. The resistor of claim 1, wherein said first substrate comprises polysilicon.

7. The resistor of claim 1, wherein said at least one first dopant is selected from the group consisting of boron, phosphorus and arsenic.

8. The resistor of claim 1, wherein said dielectric material comprises a low-k dielectric material.

9. The resistor of claim 8, wherein said low-k dielectric material comprises silicon dioxide.

10. The resistor of claim 1, further comprising at least 2 electrical connections on the resistive layer of said first substrate.

11. A method for reducing the parasitic capacitance of a resistor comprising the steps of:
    (a) implanting the surface of a first substrate disposed in a chosen dielectric material with an effective amount of at least one first dopant to a chosen depth, forming thereby a resistive layer having a chosen area and having an inter-layer dielectric parasitic capacitance; and
    (b) forming a p-type layer on the surface of an n-type substrate, the n-type substrate being disposed within a p-type substrate and spaced apart from the first substrate, wherein the p-type layer has an effective amount of at least one second dopant, wherein the p-type layer is approximately co-extensive with the resistive layer and parallel thereto, and wherein the p-type layer is in contact with the dielectric material, thereby generating a depletion region which behaves as a reversed-biased diode having a capacitance which is series-coupled with the inter-layer dielectric capacitance of the resistive layer.

12. The method of claim 11, further comprising the step of placing the n-type substrate in electrical connection with an electrical ground potential or a chosen voltage, thereby increasing the depletion region.

13. The method of claim 11, wherein the n-type substrate and said p-type substrate comprise crystalline silicon.

14. The method of claim 11, wherein the at least one second dopant comprises boron.

15. The method of claim 11, wherein the dielectric material comprises a low-k dielectric material.

16. The method of claim 15, wherein the low-k dielectric material comprises silicon dioxide.

17. The method of claim 11, further comprising the step of forming electrical connections on the resistive layer.

18. The method of claim 11, wherein the first substrate comprises polysilicon.

19. The method of claim 18, wherein the at least one first dopant is selected from the group consisting of boron, phosphorus and arsenic.

20. A method for reducing the parasitic capacitance of a resistor comprising the steps of:
    (a) implanting the surface of a first substrate disposed in a chosen dielectric material with an effective amount of at least one first dopant to a chosen depth, forming thereby a resistive layer having a chosen area and having an inter-layer dielectric parasitic capacitance; and
    (b) forming a n-type layer on the surface of a p-type substrate, the p-type substrate being disposed within the dielectric material and spaced apart from the first substrate, wherein the n-type layer has an effective amount of at least one second dopant, wherein the n-type layer is approximately co-extensive with the resistive layer and parallel thereto, and wherein the n-type layer is in contact with the dielectric material, thereby generating a depletion region which behaves as a reversed-biased diode having a capacitance which is series-coupled with the inter-layer dielectric capacitance of the resistive layer.

21. The method of claim 20, further comprising the step of placing the n-type substrate in electrical connection with an electrical ground potential or a chosen voltage, thereby increasing the depletion region.

22. The method of claim 20, wherein the n-type substrate and said p-type substrate comprise crystalline silicon.

23. The method of claim 22, wherein the at least one second dopant is selected from the group consisting of arsenic and phosphorus.

24. The method of claim 20, wherein the first substrate comprises polysilicon.

25. The method of claim 20, wherein the at least one first dopant is selected from the group consisting of boron, phosphorus and arsenic.

26. The method of claim 20, wherein the dielectric material comprises a low-k dielectric material.

27. The method of claim 26, wherein the low-k dielectric material comprises silicon dioxide.

28. The method of claim 20, further comprising the step of forming electrical connections on the resistive layer.

* * * * *